(12) United States Patent
Hettler et al.

(10) Patent No.: US 11,011,654 B2
(45) Date of Patent: May 18, 2021

(54) LENS CAP, PHOTODIODE WITH A LENS CAP, AND METHOD FOR PRODUCING SAME

(71) Applicant: Schott AG, Mainz (DE)

(72) Inventors: Robert Hettler, Kumhausen (DE); René Nauthe, Teugn (DE); Georg Mittermeier, Landshut (DE)

(73) Assignee: Schott AG, Mainz (DE)

( * ) Notice: Subject to any disclaimer, the term of this patent is extended or adjusted under 35 U.S.C. 154(b) by 39 days.

(21) Appl. No.: 16/295,268

(22) Filed: Mar. 7, 2019

(65) Prior Publication Data

US 2019/0280131 A1 Sep. 12, 2019

(30) Foreign Application Priority Data

Mar. 7, 2018 (DE) .................. 10 2018 105 171.9

(51) Int. Cl.
| | | |
|---|---|---|
| *H01L 31/0203* | (2014.01) |
| *H01L 31/18* | (2006.01) |
| *H04B 10/67* | (2013.01) |
| *G02B 6/42* | (2006.01) |
| *H01L 31/0232* | (2014.01) |

(52) U.S. Cl.
CPC ........ *H01L 31/0203* (2013.01); *G02B 6/4206* (2013.01); *H01L 31/02327* (2013.01); *H01L 31/18* (2013.01); *H04B 10/67* (2013.01)

(58) Field of Classification Search
None
See application file for complete search history.

(56) References Cited

U.S. PATENT DOCUMENTS

| | | | | |
|---|---|---|---|---|
| 2006/0081866 A1* | 4/2006 | Takahashi | .............. | B82Y 20/00 257/99 |
| 2017/0294390 A1* | 10/2017 | Hettler | .................. | H01L 23/564 |

FOREIGN PATENT DOCUMENTS

| | | |
|---|---|---|
| DE | 10 2016 103 366 A1 | 8/2017 |
| DE | 10 2016 106 366 A1 | 10/2017 |

* cited by examiner

*Primary Examiner* — Moazzam Hossain
*Assistant Examiner* — Stanetta D Isaac
(74) *Attorney, Agent, or Firm* — Taylor IP, P.C.

(57) ABSTRACT

A photodiode with a lens cap is provided, having a header with a photodiode active surface area where the photodiode active surface area has a diameter $d_F$. Further included is a cap having a fused-in lens, the fused-in lens having a diameter $d_L$ shown in a top plan view of the cap. The ratio of the diameter of the fused-in lens to the diameter of the photodiode active surface area, $d_L/d_F$, is greater than 30.

20 Claims, 5 Drawing Sheets

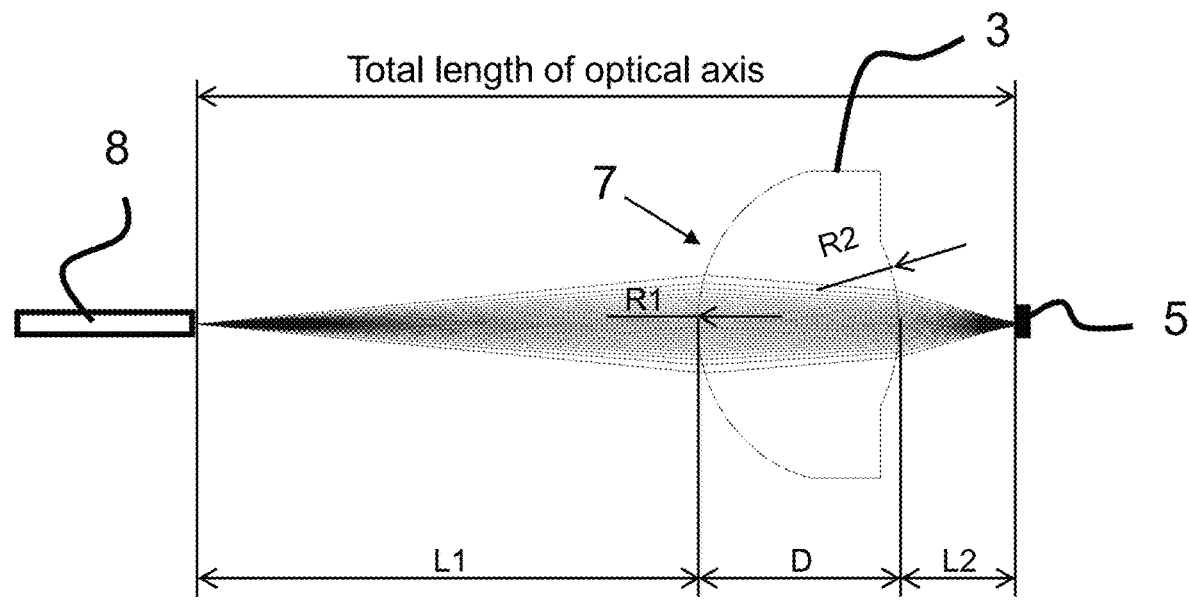
Fig. 3
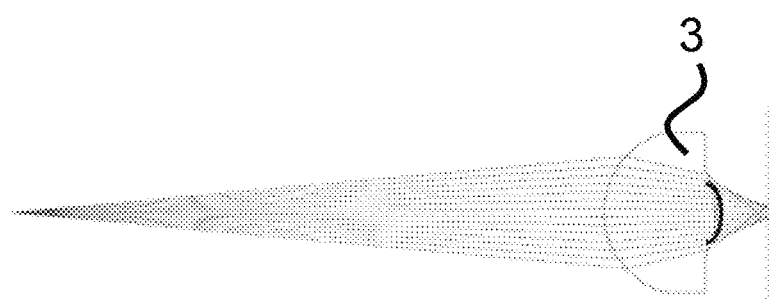
Fig. 4
Refractive index 1.5
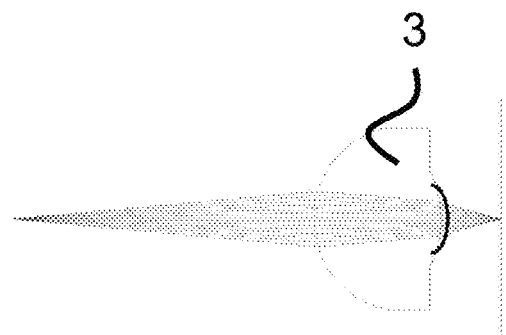
Refractive index 1.8   Fig. 5

LENS CAP, PHOTODIODE WITH A LENS CAP, AND METHOD FOR PRODUCING SAME

BACKGROUND OF THE INVENTION

1. Field of the Invention

The invention relates to a photodiode with a lens cap, more particularly, to a photodiode used to couple light from a light-conducting fiber into a photodiode chip and convert it into an electrical signal. The invention further relates to a lens cap for a photodiode and to a method for producing a lens cap. The invention furthermore encompasses the use of such a photodiode in a data transmission network that is based on optical signal transmission.

2. Description of the Related Art

Photodiodes provided with a lens cap that are used in the field of optical signal transmission are known.

For example, patent DE 10 2016 106 366 B4 (Schott A G) discloses a lens cap for a TO (Transistor Outline) housing in which the wall of the upper side of the housing is thinned adjacent to the lens. In this way, mechanical stresses are reduced, which are caused by the high temperature during fusing in of the lens.

Such a lens cap, which may be manufactured as a deep-drawn component, for example, is connected, in particular soldered, to a header. On the header, the chip with the active surface area of the laser diode is arranged.

In order to increase the transfer rate, fast switching of the photodiode is required. To achieve this, the capacitance of the barrier layer of the photodiode should be kept as small as possible. A reduction in the capacitance of the barrier layer can be achieved, above all, by reducing the active surface area of the photodiode.

SUMMARY OF THE INVENTION

The invention provides a photodiode with a lens cap, a lens cap, and a method for producing it, which allow to provide, in a simple manner, a photodiode with a small active surface area and correspondingly high possible data transfer rates. The invention also contributes to an increase in the data transfer rate in data transmission networks.

The invention relates to a photodiode with a lens cap. The photodiode with the lens cap includes a header with a photodiode active surface area. The header, in particular a metal header, may be made of a low-expansion material and is connected to the lens cap, in particular welded thereto.

On the header, a chip is disposed exhibiting the photodiode active surface area that is used to convert an optical signal into an electrical signal. The invention in particular relates to a photodiode which is configured for use on the receiver side, that is to say which is used to convert the optical signal of the light guide into an electrical signal. The lens cap with the header and the photodiode in particular form part of a data transmission network.

The photodiode may include a cap with a fused-in lens. The cap is in particular a deep-drawn component which includes at least one, preferably exactly one window, into which a glass lens has been fused. The cap may have a cylindrical shape, in particular a circular cylindrical shape, and/or a cup-like shape, with a window formed in the base wall thereof.

The lens is materially bonded to the cap. The fused-in lens has a diameter & as seen in a plan view of the upper surface of the cap. In the context of the invention, upper surface refers to the outer surface of the lens cap on the side of the fused-in lens. This is in particular the underside of the base wall of the cup-shaped lens cap.

On the upper surface of the cap, the fused-in lens defines a diameter $d_L$. The lens is in particular formed as a lens having a lens stem, which means that an upper portion of the lens is larger than the window into which the lens is fused. The lens stem which has a diameter smaller than the diameter $d_L$ protrudes into this window. Therefore, it will be understood that the fused-in lens may have a different diameter on the underside, as defined by the lens stem, than on the upper side.

According to another embodiment of the invention, the ratio of the diameter of the fused-in lens to the diameter of the photodiode active surface area $d_L/d_F$ is greater than 30, preferably greater than 35, and more preferably greater than 40.

Hitherto, photodiodes with an active surface area of 60 to 70 µm diameter have commonly been used. In this case, the ratio of the diameter of the fused-in lens to the diameter of the photodiode active surface area $d_L/d_F$ is generally between 20 and 25.

The invention, by contrast, suggests, instead of reducing the diameter of the fused-in lens in correlation with the reduction of the diameter of the photodiode active surface area, to increase this ratio compared to the prior art, so as to use a rather large lens for a relatively small photodiode active surface area.

It has been found that it is still possible to achieve a sufficiently small spot, despite use of the large lens. The spot can also be considered as an image size. The core of the light-conducting fiber is imaged onto the active surface area of the photodiode.

According to one embodiment of the invention, the ratio of diameters $d_L$ to $d_F$ is less than 80, preferably less than 70, and more preferably less than 65.

The glass that is used for the fused-in lens may have a refractive index n @ 589 nm of greater than 1.55, preferably greater than 1.58, and most preferably greater than 1.59.

By using a rather high-index fusing glass, it has been possible to provide a sufficiently small spot despite the large lens, as described above.

In one embodiment of the invention, the photodiode active surface area, i.e., the photosensitive area of the photodiode, has a diameter of less than 40 µm, preferably less than 35 µm.

The photodiode active surface area is usually circular. If the photodiode active surface area is not circular in shape, the minimum diameter is referred to in the sense of the invention, in the case of a square shape of the photodiode active surface area in particular the inner diameter, i.e., the diameter of a circle just fitting into the square.

According to another embodiment of the invention, the fused-in lens has a diameter & of more than 1.2 mm, preferably more than 1.3 mm, most preferably more than 1.5 mm, and/or of less than 2.0 mm, preferably less than 1.8 mm.

Furthermore, a glass having a coefficient of linear thermal expansion α, averaged @ 20-300° C., of less than 14 ppm/K, preferably less than 10 ppm/K is used for the fused-in lens.

In one embodiment, there may be provided a photodiode with a lens cap which is designed for transfer rates of 25 gigabits per second (Gbps) or more.

The invention furthermore relates to a lens cap, in particular a lens cap for the photodiode described above, and in particular a lens cap which can have the features as described above in conjunction with the lens cap.

The lens cap is made as a metal cap, in particular as a deep-drawn metal cap including a fused-in lens made of glass having a refractive index n of greater than 1.55, preferably greater than 1.58, most preferably greater than 1.59.

The invention furthermore relates to a lens cap, in particular a lens cap for the photodiode described above, and in particular a lens cap which can have the features as described above in conjunction with the lens cap.

The lens cap is made as a metal cap, in particular as a deep-drawn metal cap including a fused-in lens made of glass that has a coefficient of linear thermal expansion α, averaged @ 20 300° C., of less than 14 ppm/K, preferably less than 10 ppm/K.

In particular, the combination of a high refractive index glass which at the same time has a low coefficient of linear thermal expansion, it is possible to provide a lens cap which, despite a relatively large lens radius, projects a spot as small as possible.

At the same time it is possible thereby to reduce the entire length of the optical system from the end of the light guide to the active surface of the photodiode.

In particular, due to the low coefficient of linear thermal expansion of the glass it is possible to provide such a lens as a fused-in lens.

In one embodiment of the invention, the metal cap is made of a material which has a coefficient of linear thermal expansion that is 0.95 to 1.05 times that of the glass of the fused-in lens.

The metal cap may, for example, be made of an iron-nickel alloy, iron-nickel-cobalt, or iron-nickel-chromium, in particular of an iron-nickel alloy with a coefficient of linear thermal expansion between 5 and 8 ppm/K.

Alloys with a low coefficient of linear thermal expansion are available, for example, under the trade names Kovar®, Dilaton 46®, Dilaton 51®, and Pernifer 48®.

In order to achieve good adhesion of the molten glass to the cap, the material of the cap may be pre-oxidized. In other words, there is an oxide layer between the molten glass and the material of the cap, which has a uniform thickness. The oxide layer improves adhesion of the molten glass to the metal of the cap. Such adhesion is important for the operational safety and reliability of the component. In particular, the combination of the materials mentioned with the high refractive index glasses having a refractive index of more than 1.55 allows production of oxide weights of 0.12 to 0.22 mg/cm$^2$ metal in the materials mentioned. This range has proven to be advantageous. The oxide weight is determined by oxidizing a non-oxidized metal specimen in the furnace process that is to be used and measuring the weight gain.

According to another embodiment of the invention, once the lens has been fused-in, the cap is provided with an anti-corrosion layer, in particular a nickel- and/or gold-containing layer.

The fused-in lens may in particular be made of a heavy flint glass or a heavy crown glass.

The invention furthermore relates to a method for producing a lens cap, in particular a lens cap as described above, or for producing a photodiode with a lens cap as described above.

A fused-in lens is fused into the window of a metal cap.

According one embodiment, a glass having a refractive index n of greater than 1.55 is used for the glass of the fused-in lens.

In particular a glass with a refractive index greater than 1.58, preferably greater than 1.59, and/or with a coefficient of linear thermal expansion α of less than 14 ppm/K, preferably less than 10 ppm/K is used. Furthermore, the glass may have a coefficient of linear thermal expansion α of more than 7 ppm/K.

Furthermore, a glass is used which exhibits a continuous viscosity profile at least at a viscosity ν between $10^6$ and $10^4$ dPa·s.

The viscosity can in particular be determined according to DIN ISO 7884-2, 3 or 5 (Edition 1998-02).

A continuous viscosity profile is understood as a viscosity profile which does not exhibit a jump in the viscosity curve. In many glasses, crystal structures are forming especially at temperatures above 700° C., which causes a jump in the viscosity curve. The viscosity profile curve in particular exhibits a turning point when crystal formation is reached, i.e., the viscosity abruptly decreases less until again decreasing stronger when this turning point is reached. It has been found that this considerably impairs the optical properties as well as the fusibility with the metal cap of the fused-in lens according to the invention.

Glasses suitable for implementing the invention are in particular available under the trade names Schott® N-SF8, P-SK60, and P-SK58A. These glasses exhibit good processability and can be fused in without crystallizing, without becoming cloudy, and with good adherence.

The glass that is used should at the same time be resistant to electroplating processes and withstand a temperature of 85° C. and a relative humidity of 85% over a period of 1,000 hours. This is in particular the case for the glasses mentioned above.

The fused-in lens is in particular fused in at a temperature of more than 700° C. and/or less than 1000° C.

The invention furthermore relates to a lens cap which can be produced by the method described above, and in particular which was produced by the method described above.

With the invention it was furthermore possible to reduce the length of the lens cap.

Furthermore, surprisingly, it was possible to reduce the influence of the lens aperture.

The inner aperture is only partially illuminated, so that the so-called 'aperture effect' is reduced. So there is no risk that light will be screened off by the inner aperture as the latter is fully illuminated. In particular, it is possible to achieve a length from the fiber end to the photodiode active surface of less than 6 mm, most preferably less than 5.5 mm.

The invention furthermore relates to the use of a photodiode as described above in a data transmission network, in particular in an optical receiver.

The optical receiver may be configured such that light of a light guide of a light-conducting fiber is projected onto the photodiode active surface area as a spot, which spot has a diameter of less than 40 μm, preferably less than 35 μm, most preferably less than 20 μm.

Accordingly, the spot projected onto the active surface area by the lens should be reduced in size as well.

In the case of fused-in lenses, a reduction of the projected spot is achievable, above all, through a reduction in the diameter of the lens.

Fused-in lenses are provided by placing a glass body in a window of the metal cap and melting it.

Due to the surface tension of the glass, a lens forms in the window of the cap.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 3 is a schematic view of the optical system having a photodiode chip, lens, and light-conducting fiber according to the present invention;

FIG. 4 illustrates the optical system according to the present invention which uses a lens with a refractive index of 1.5;

FIG. 5 shows use of a lens according to the present invention with a refractive index of 1.8;

Corresponding reference characters indicate corresponding parts throughout the several views. The exemplifications set out herein illustrate embodiments of the invention and such exemplification are not to be construed as limiting the scope of the invention in any manner.

DETAILED DESCRIPTION OF THE INVENTION

Figure 1:
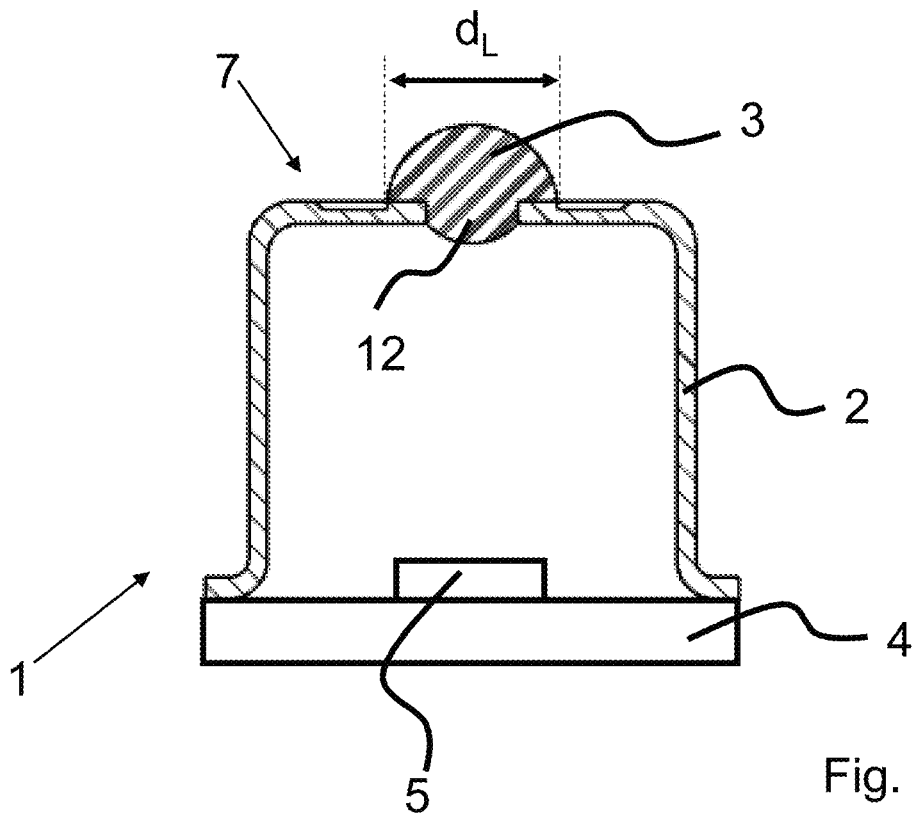
FIG. 1 is a schematic sectional view of a photodiode having a lens cap according to the present invention.

Referring now to the drawings, and more particularly to FIG. 1, there is shown a schematic view of a photodiode 1 having a lens cap.

The photodiode 1 with lens cap includes a cap 2 made of metal and is formed as a deep-drawn component, with a fused-in glass lens 3 fused into the cap.

The fused-in lens 3 is formed as a lens having a stem, which means that the lens stem 12 projecting through the window of the cap 2 has a smaller diameter than the overlying portion of the fused-in lens 3.

By definition, the upper surface 7 is the surface seen in a top plan view of the cup-shaped cap 2 from outside.

In the top plan view of the upper surface, the fused-in lens 3 has a diameter $d_L$. In this exemplary embodiment, the upper wall of cap 2 is thinned around the fused-in lens 3, to reduce mechanical stresses.

Cap 2 is connected to a header 4 which is shown schematically here. Header 4 may be made of metal, in particular of metal having a coefficient of linear thermal expansion α of less than 10 ppm/K.

On header 4, a chip 5 is mounted, which includes, inter alia, the active surface area of the photodiode through which light is converted into voltage.

It will be understood that further details such as connection pins, wiring, etc., are not shown in this schematic view.

Figure 2:
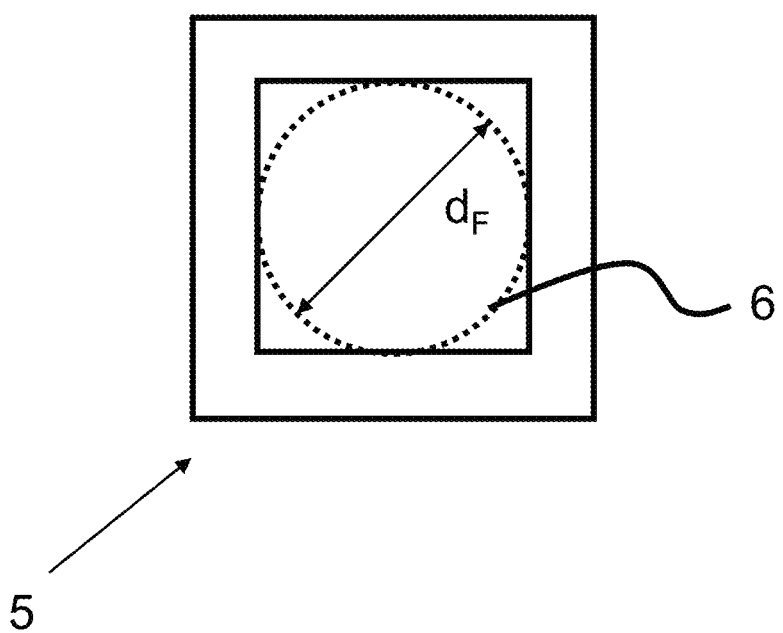
FIG. 2 is a schematic top plan view of the chip provided in the photodiode with lens cap according to the present invention.

FIG. 2 is a schematic top plan view of the chip 5 arranged on header 4.

The chip 5 includes a photodiode with the photodiode active surface area 6 which is circular in this embodiment and has a diameter $d_F$.

A light spot emanating from a light-conducting fiber is projected onto the photodiode active surface area 6 through the fused-in lens 3.

FIG. 3 is a schematic view of the overall optical system.

Optical fiber 8 is spaced from the fused-in lens 3 by a length L1.

Fused-in lens 3 is effective as a converging lens.

From the upper surface 7, the light emitted from the core of optical fiber 8 enters the fused-in lens 3 which has a thickness D, and a spot is projected onto the active photodiode surface area 6 of chip 5 which is spaced from the fused-in lens 3 by a length L2.

The upper surface of fused-in lens 3 has a radius R1 which corresponds to half the diameter of the fused-in lens 3 in the sense of the invention.

On the underside the fused-in lens 3 has a radius R2 which may differ from radius R1.

FIG. 4 shows the use of a fused-in lens 3 having a refractive index of 1.5, and FIG. 5 shows the use of a fused-in lens 3 having a refractive index of 1.8.

As can be seen here, with the higher refractive index, both the diameter of the spot on the side of the chip 5 and the distance L1 from the light-conducting fiber 8 has been reduced.

The installation length of the photodiode with lens cap 1 is shorter, due to the shorter distance between the photodiode active surface area 6 and the emission end of the light-conducting fiber 8, and at the same time the projected spot is smaller.

Furthermore, the inner aperture is only partially illuminated, so that there is no risk for light components to be screened off by the inner aperture.

With a refractive index of 1.5, as shown in FIG. 4, a diameter of the projected spot of about 70 μm is achieved in a test setup. The length of the optical axis was more than 7 mm in this case.

With the fused-in lens having a refractive index of 1.8, as illustrated in FIG. 5, by contrast, it was possible to reduce the length of the optical axis to about 4 mm. At the same time, the diameter of the projected spot is only about 7 μm, so it was reduced to about one-tenth. This shows the surprising influence of the refractive index on the spot's diameter.

Figure 6:
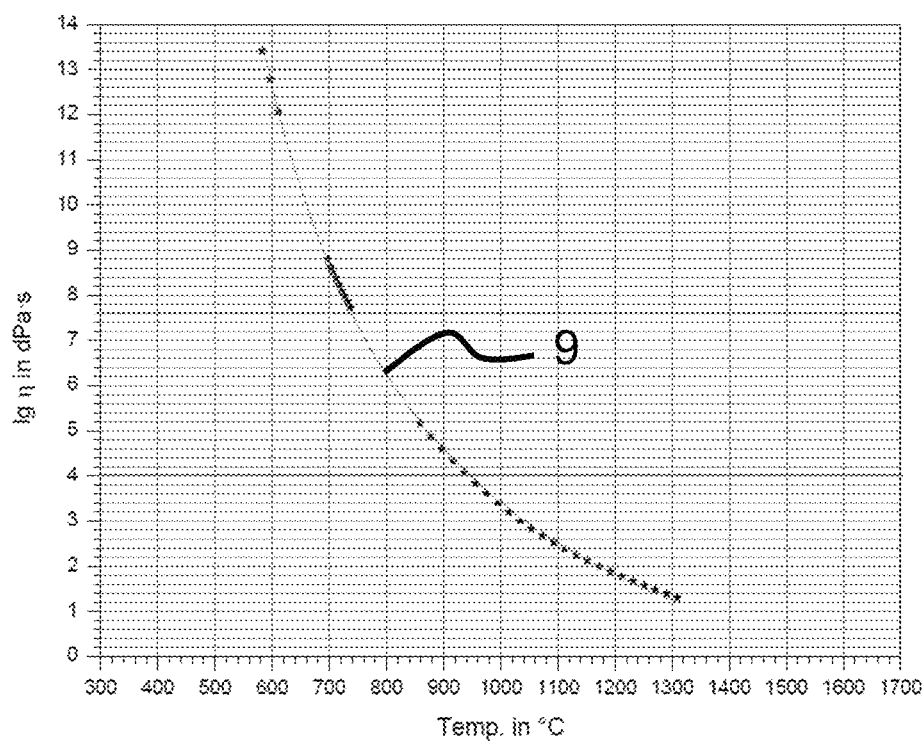
FIG. 6 shows the viscosity curve of a glass which is particularly suitable for the present invention.

FIG. 6 shows the viscosity curve of a glass which is suitable for the invention in a temperature range of approximately 600 to 1200° C.

It can be seen that the viscosity profile 9 is continuous, i.e., the viscosity decreases continuously and steadily with increasing temperature. This is in particular true for the temperature range from 700 to 1000° C., in which the fused-in lens may be fused in.

Figure 7:
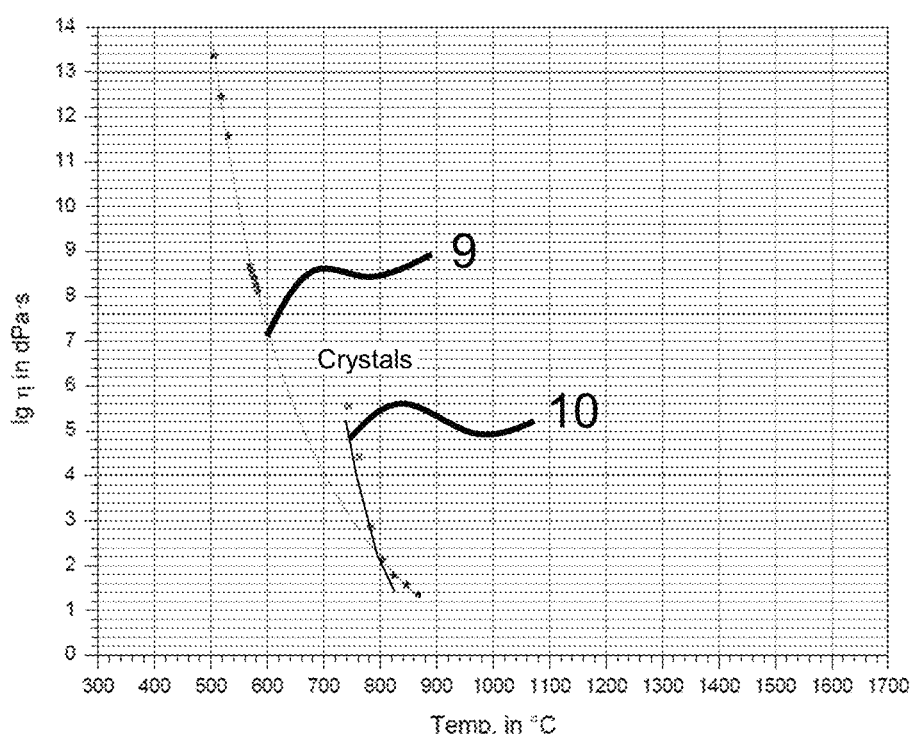
FIG. 7 shows the viscosity curve of a glass which is insufficient for the present invention.

FIG. 7, by contrast, shows the viscosity curve of a glass which is less suitable for the invention.

It can be seen that in a temperature range between 700 and 800° C. there is a region 10 in which the viscosity deviates abruptly from the averaged curve of viscosity profile 9. Due to crystal formation, the viscosity changes abruptly between 700 and 800° C. In particular, when reaching crystal formation the viscosity does not decrease any longer, or decreases less than before. This has been found to be detrimental to the optical properties of the fused-in lens. In particular, it may cause cloudiness. Also, the mechanical material bond between the lens and the metal part is reduced with such a glass.

Figure 8:
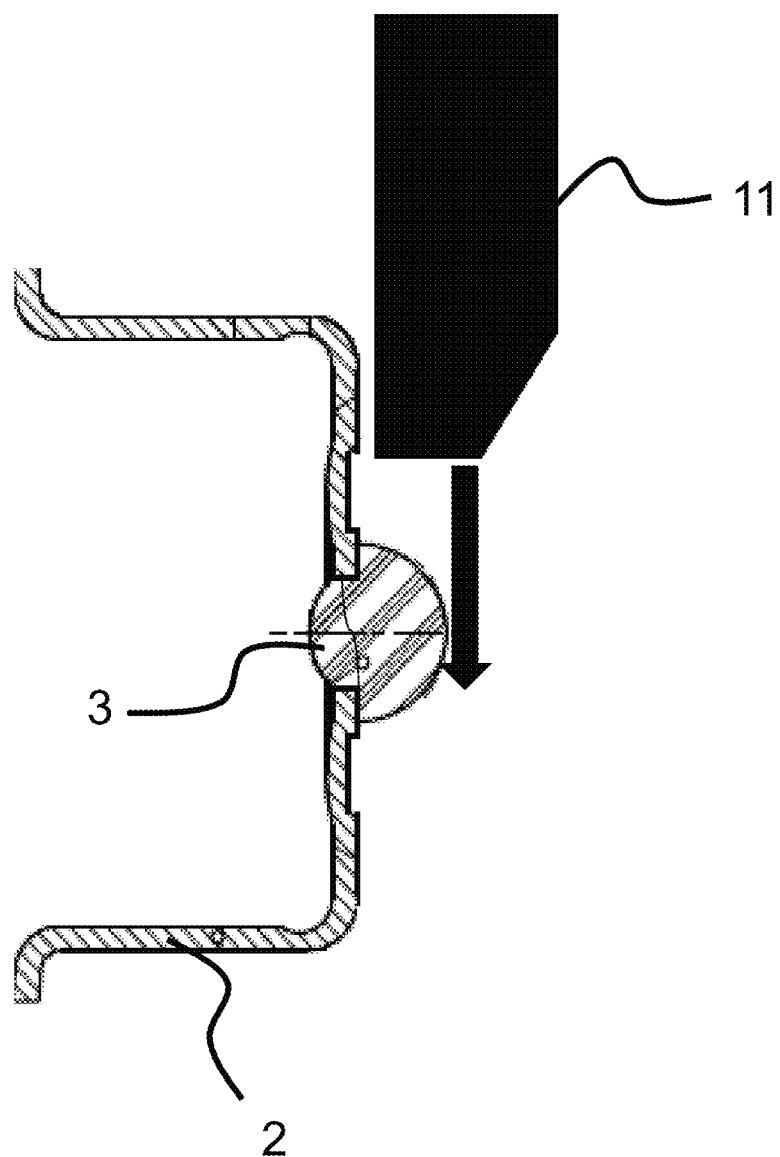
FIG. 8 shows shear testing of the lens and cap assembly of the present invention.

FIG. 8 is a schematic view illustrating how the adhesion of the fused-in lens 3 in the cap can be tested by a shear test.

The fused-in lens 3 or part of the fused-in lens 3 is sheared off by a testing body 11 that is guided parallel to the upper surface of the cap 2. The force required for this is measured.

It has been shown that shear forces of more than 50 N can be achieved. At the same time, glass residues are found on the metal of the cap, and metal cap residues on the glass, which is a sign of good bonding of the glass-to-metal bond.

This is in particular achieved by a pre-oxidation of the iron-nickel alloy which is used for the metal cap 2.

Figure 9:
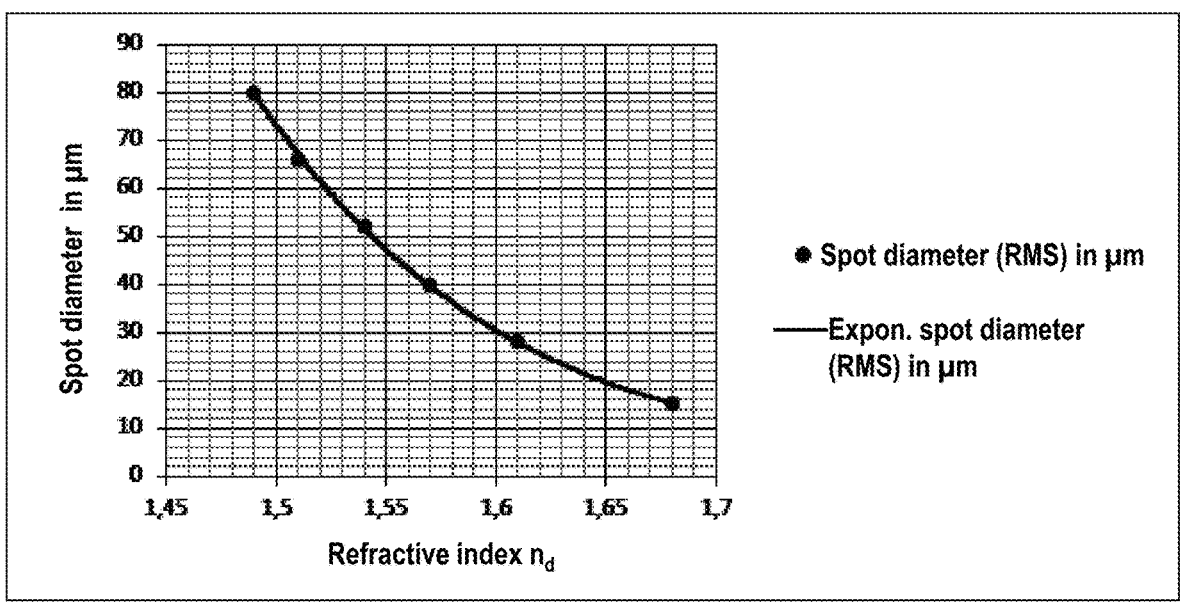
FIG. 9 shows the influence of the refractive index of the glass used for the fused-in lens on the diameter of the spot projected onto the photodiode chip for the present invention.

FIG. 9 shows a graph in which the refractive index is plotted on the x-axis, and the diameter of a spot of light of a mono-mode fiber projected onto a photodiode active surface area through an exemplary fused-in lens is plotted on the y-axis. The curve has been approximated exponentially here.

It can be seen that the spot diameter decreases surprisingly strongly with increasing refractive index.

For example, with an increase in the refractive index from 1.5 to 1.6, the spot diameter is already reduced to less than half.

The invention may be provided to supply a lens cap and a photodiode with a lens cap, in which the lens projects a smallest possible spot onto the photodiode.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF REFERENCE NUMERALS

1 Photodiode with lens cap
2 Cap
3 Fused-in lens
4 Header
5 Chip
6 Photodiode active surface area
7 Upper surface
8 Optical fiber
9 Viscosity curve
10 Region with jump in viscosity curve
11 Testing body
12 Lens stem

What is claimed is:

1. A photodiode with a lens cap, the photodiode comprising:
a header having a photodiode active surface area, the photodiode active surface area having a diameter dF;
a lens fused into the lens cap, the fused-in lens having a diameter dL, the diameter dL and the diameter dF having a ratio dL/dF that is greater than 30.

2. The photodiode of claim 1, wherein the ratio dL/dF is less than 80.

3. The photodiode of claim 1, wherein the fused-in lens is made of a glass having a refractive index n of greater than 1.55 at a wavelength of 589 nm.

4. The photodiode of claim 3, wherein the fused-in lens is made of a glass having a refractive index n of greater than 1.59 at a wavelength of 589 nm.

5. The photodiode of claim 1, wherein the photodiode is designed for transfer rates at 25 Gbps or more.

6. The photodiode of claim 1, wherein the diameter dF is less than 40 μm.

7. The photodiode of claim 1, wherein the lens cap is a metal cap and the fused-in lens is made of a glass having a refractive index n of greater than 1.55 at a wavelength of 589 nm.

8. The photodiode of claim 1, wherein the lens cap is a metal cap and the fused-in lens is made of a glass having a coefficient of linear thermal expansion α of less than 14 ppm/K at 20-300° C.

9. The photodiode of claim 8, wherein the metal cap is made of a material having a coefficient of linear thermal expansion that is 0.95 to 1.05 times that of the glass of the fused-in lens.

10. The photodiode of claim 8, wherein the coefficient of linear thermal expansion α is less than 10 ppm/K at 20-300° C.

11. The photodiode of claim 1, wherein the fused-in lens is made of a heavy flint glass or a heavy crown glass.

12. The photodiode of claim 1, wherein the ratio dL/dF is greater than 40.

13. The photodiode of claim 1, wherein the ratio dL/dF is less than 65.

14. The photodiode of claim 1, wherein the diameter dL is between 1.2 mm and 2.0 mm.

15. A lens cap, comprising:
a metal cap having a window;
a fused-in lens in the window of the metal cap, the fused-in lens is a glass that has a refractive index n of more than 1.55 and exhibits a continuous viscosity profile at a viscosity between $10^4$ and $10^6$ dPa·s.

16. The lens cap of claim 15, wherein the fused-in lens is fused in at a temperature of more than 700° C.

17. The lens cap of claim 15, wherein the glass used for the fused-in lens has a coefficient of linear thermal expansion α of less than 14 ppm/K at 20-300° C.

18. A photodiode for a data transmission network, the photodiode comprising:
a header having a photodiode active surface area, the photodiode active surface area having a diameter dF;
a lens cap;
a lens fused into the lens cap, the fused-in lens having a diameter dL, the diameter dL and the diameter dF having a ratio dL/dF that is greater than 30.

19. The photodiode of claim 18, wherein the photodiode is assembled into an optical receiver of a data transmission network.

20. The photodiode of claim 18, wherein the optical receiver includes a light conducting fiber having a light guide, the light guide being configured to project a spot of light having a diameter of less than 40 μm onto the photodiode surface area.

* * * * *

UNITED STATES PATENT AND TRADEMARK OFFICE
CERTIFICATE OF CORRECTION

| | |
|---|---|
| PATENT NO. | : 11,011,654 B2 |
| APPLICATION NO. | : 16/295268 |
| DATED | : May 18, 2021 |
| INVENTOR(S) | : Robert Hettler et al. |

It is certified that error appears in the above-identified patent and that said Letters Patent is hereby corrected as shown below:

In the Specification

Column 2
At Line 2, please delete "diameter &", and substitute therefore --diameter $d_L$--.

Signed and Sealed this
Seventh Day of March, 2023

Katherine Kelly Vidal
*Director of the United States Patent and Trademark Office*